United States Patent
Lu et al.

(10) Patent No.: US 9,034,569 B2
(45) Date of Patent: May 19, 2015

(54) EXTREME ULTRAVIOLET LITHOGRAPHY PROCESS AND MASK

(71) Applicant: Taiwan Semiconductor Manufacturing Company, Ltd., Hsin-Chu (TW)

(72) Inventors: Yen-Cheng Lu, New Taipei (TW); Shinn-Sheng Yu, Hsinchu (TW); Jeng-Horng Chen, Hsin-Chu (TW); Anthony Yen, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/209,450

(22) Filed: Mar. 13, 2014

(65) Prior Publication Data

US 2014/0272721 A1    Sep. 18, 2014

Related U.S. Application Data

(60) Provisional application No. 61/780,130, filed on Mar. 13, 2013.

(51) Int. Cl.
*G03F 7/26* (2006.01)
*G03F 7/22* (2006.01)

(52) U.S. Cl.
CPC ........................................ *G03F 7/22* (2013.01)

(58) Field of Classification Search
CPC ............. G03F 1/144; G03F 7/22; G03F 1/36; G03F 7/70466; G03F 7/70633; G03F 7/70716; G03F 7/702; G03F 7/70033; G03F 1/24; G03F 7/70075; G03F 7/70558; G03F 1/38; G03F 7/70358; G03F 7/70783; H01L 21/31144; H01L 21/67748
USPC ...................................... 430/395, 397, 322, 5
See application file for complete search history.

(56) References Cited

U.S. PATENT DOCUMENTS

2005/0142458 A1*  6/2005  Lee et al. ........................... 430/5
2008/0057440 A1*  3/2008  Mulkens et al. ............... 430/311

* cited by examiner

*Primary Examiner* — Caleen Sullivan
(74) *Attorney, Agent, or Firm* — Haynes and Boone, LLP

(57) ABSTRACT

An extreme ultraviolet lithography (EUVL) process is performed on a target, such as a semiconductor wafer, having a photosensitive layer. The method includes providing a one-dimensional patterned mask along a first direction. The patterned mask includes a substrate including a first region and a second region, a multilayer mirror above the first and second regions, an absorption layer above the multilayer mirror in the second region, and a defect in the first region. The method further includes exposing the patterned mask by an illuminator and setting the patterned mask and the target in relative motion along the first direction while exposing the patterned mask. As a result, an accumulated exposure dose received by the target is an optimized exposure dose.

20 Claims, 6 Drawing Sheets

EXTREME ULTRAVIOLET LITHOGRAPHY PROCESS AND MASK

This patent claims the benefit of U.S. Ser. No. 61/780,130 filed Mar. 13, 2013, which is hereby incorporated by reference.

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, the need to perform higher resolution lithography processes grows. One lithography technique is extreme ultraviolet (EUV) lithography. Other techniques include X-Ray lithography, ion beam projection lithography, electron beam projection lithography, and multiple electron beam maskless lithography.

EUV lithography is a promising patterning technology for very small semiconductor technology nodes, such as 14-nm, and beyond. EUV lithography is very similar to optical lithography in that it needs a mask to print wafers, except that it employs light in the EUV region, e.g., at about 13.5 nm. At the wavelength of 13.5 nm, most materials are highly absorbing. Thus, reflective optics, rather than refractive optics, are commonly used in EUV lithography. Although existing methods of EUV lithography have been generally adequate for their intended purposes, they have not been entirely satisfactory in all respects. For example, defect printability becomes a more severe issue in EUV lithography. So it is desired to have further improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
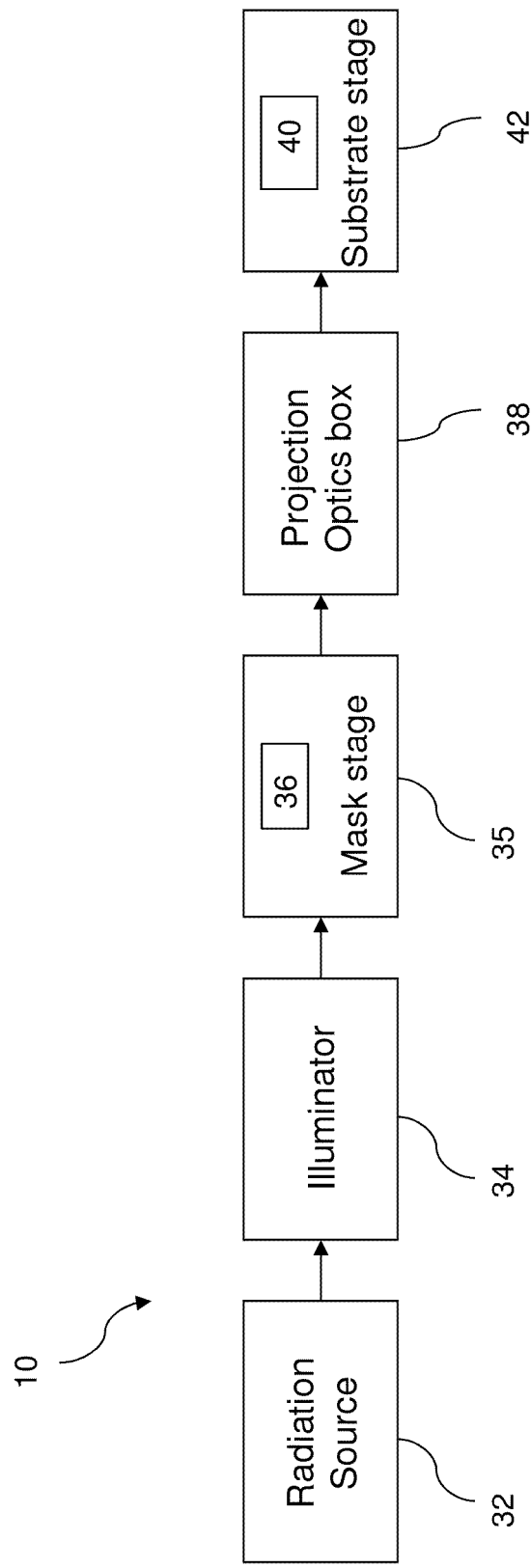
FIG. 1 is a block diagram of a lithography system for implementing one or more embodiments constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, an EUV lithography system 10 that may benefit from one or more embodiments of the present invention is disclosed. The lithography system 10 is also illustrated, in portion, in a schematic view. In the present embodiment, the lithography system 10 is an extreme ultraviolet (EUV) lithography system designed to expose a resist layer by EUV. The resist layer is sensitive to the EUV radiation. The EUV lithography system 10 employs a radiation source 32 to generate EUV light, such as EUV light having a wavelength ranging between about 1 nm and about 100 nm. In one particular example, the EUV radiation source 32 generates a EUV light with a wavelength centered at about 13.5 nm.

The EUV lithography system 10 also employs an illuminator 34. In various embodiments, the illuminator 34 includes various refractive optic components, such as a single lens or a lens system having multiple lenses (zone plates) or reflective optics, such as a single mirror or a mirror system having multiple mirrors in order to direct light from the radiation source 32 onto a mask 36. In the present embodiment where the radiation source 32 that generates light in the EUV wavelength range, reflective optics are employed. Refractive optics, however, can also be realized by zoneplates for example. In one example, the mirrors of the illuminator 34 are switchable to reflect EUV light to different illumination positions. In another embodiment, a stage prior to the illuminator 34 may additionally include other switchable mirrors that are controllable to direct the EUV light to different illumination positions with the mirrors of the illuminator 34. Accordingly, the lithography system 10 is able to achieve different illumination modes without sacrificing the illumination energy.

The EUV lithography system 10 also includes a mask stage 35 configured to secure a photomask 36 (in the present disclosure, the terms of mask, photomask, and reticle are used to refer to the same item). The mask 36 may be a transmissive mask or a reflective mask. In the present embodiment, the mask 36 is a reflective mask such as described in further detail below.

The structure of the mask 36 and the method making the same will be further described later according to various embodiments. The mask fabrication process includes two operations: a blank mask fabrication process and a mask patterning process. During the blank mask fabrication process, a blank mask is formed by deposing suitable layers (e.g., multiple reflective layers) on a suitable substrate. The blank mask is patterned during the mask patterning process to have a design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. Several masks (for example, a set of 15 to 30 masks) may be used to construct a complete IC. In general, various masks are fabricated for being used in various processes.

The following description refers to the mask 36, mask fabrication and mask repairing processes. The mask fabrication and repairing processes include three steps: a blank mask fabrication process, a mask patterning process, and a mask repairing process. During the blank mask fabrication process, a blank mask is formed by depositing suitable layers (e.g., multiple reflective layers) on a suitable substrate. The blank mask is patterned during the mask patterning process to have a design pattern for a corresponding layer of an integrated circuit (IC) device (or chip). A mask repairing process may be implemented before or after the mask patterning process to mitigate the printability of defects on the blank mask or on the patterned mask. After repairing, the patterned mask is then used to transfer the design pattern onto a semiconductor wafer. The design pattern can be transferred over and over onto multiple wafers through various lithography processes. Several masks (for example, a set of 15 to 30 masks) may be used to construct a complete IC device.

In general, various masks are fabricated for use in various processes. Types of EUV masks include binary intensity masks (BIM) and phase-shifting masks (PSM). An example BIM includes an almost totally absorptive region (also referred to as a dark region) and a reflective region. In the opaque region, an absorber is present and an incident light is almost fully absorbed by the absorber. In the reflective region, the absorber is removed and the incident light is reflected by a multilayer (ML). A PSM includes an absorptive region and a reflective region. The phase difference (generally) 180° between a portion of a light reflected from the absorptive region and a portion of the light reflected from the reflective region enhances resolution and image quality. The PSM can be an attenuated PSM (AttPSM) or an alternating PSM (AltPSM). An AttPSM usually has a reflectivity of 2%-15% from its absorber, while an AltPSM usually has a reflectivity of larger than 50% from its absorber.

Figure 2:
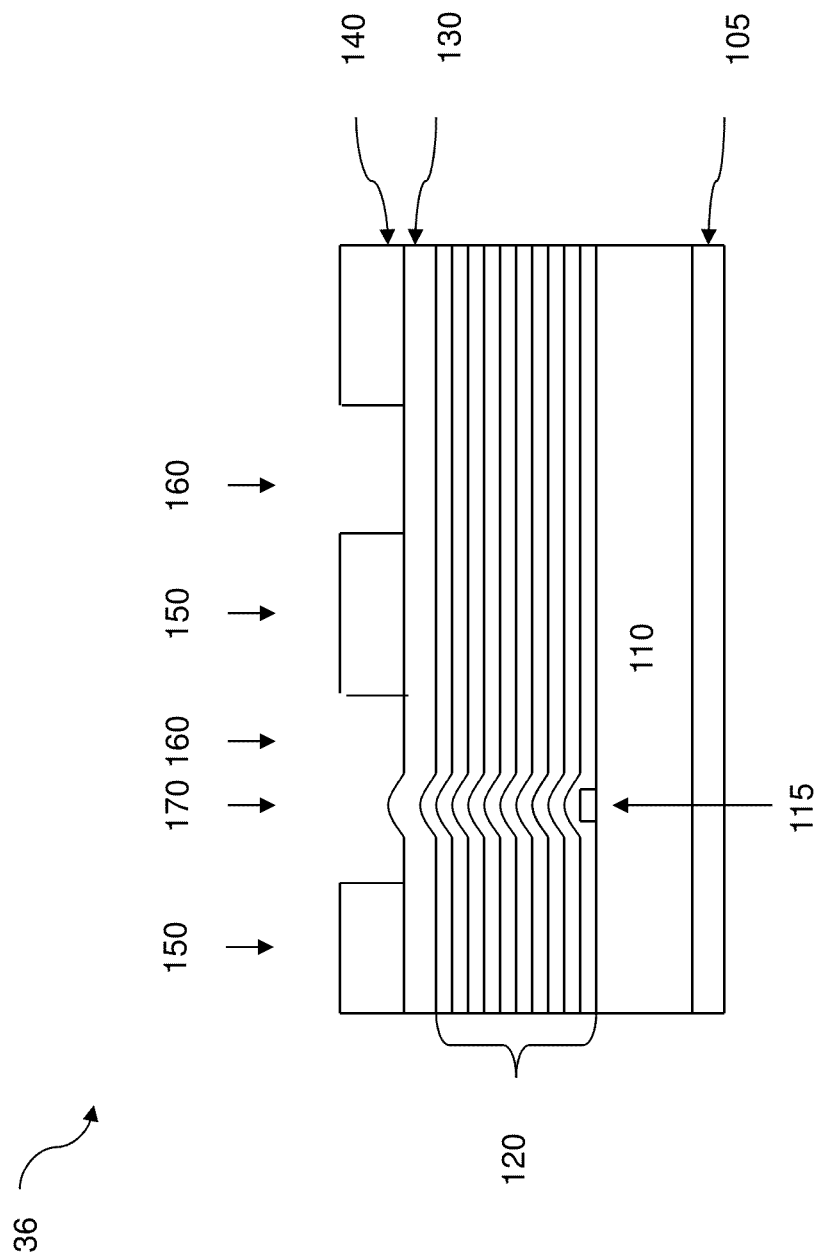
FIG. 2 is a diagrammatic cross-sectional view of various aspects of one embodiment of an EUV mask at various stages of a lithography process constructed in accordance with some embodiments.

Referring to FIG. 2, the mask 36 includes a mask substrate 110 made of low thermal expansion material (LTEM). The LTEM material may include $TiO_2$ doped $SiO_2$, and/or other low thermal expansion materials known in the art. The LTEM substrate 110 serves to minimize image distortion due to mask heating. In the present embodiment, the LTEM substrate includes materials with a low defect level and a smooth surface. In addition, a conductive layer 105 may be formed on the backside surface of the LTEM substrate 110 (as shown in the figure) for the electrostatic chucking purpose. In an embodiment, the conductive layer 105 includes chromium nitride (CrN), or other suitable conductive material.

The mask 36 includes a reflective multilayer (ML) 120 disposed over the mask substrate 110 on the front surface. According to Fresnel equations, light reflection will occur when light propagates across the interface between two materials of different refractive indices. The reflected light is larger when the difference of refractive indices is larger. To increase the reflected light, one may also increase the number of interfaces by deposing a multilayer of alternating materials and let light reflected from different interfaces interfere constructively by choosing an appropriate thickness for each layer inside the multilayer. However, the absorption of the employed materials for the multilayer limits the highest reflectivity that can be achieved. The ML 120 includes a plurality of film pairs, such as molybdenum-silicon (Mo/Si) film pairs (e.g., a layer of molybdenum above or below a layer of silicon in each film pair). Alternatively, the ML 86 may include molybdenum-beryllium (Mo/Be) film pairs, or any suitable material that is highly reflective at EUV wavelengths. The thickness of each layer of the ML 120 depends on the EUV wavelength and the incident angle. The thickness of the ML 120 is adjusted to achieve a maximum constructive interference of the EUV light reflected at each interface and a minimum absorption of the EUV light by the ML 120. The ML 120 may be selected such that it provides a high reflectivity to a selected radiation type and/or wavelength. In a typical example, the number of the film pairs in the ML 120 ranges from 20 to 80, however any number of film pairs is possible. In one example, the ML 120 includes forty pairs of layers of Mo/Si. Each Mo/Si film pair has a thickness of about 7 nm, with a total thickness of 280 nm. In this case, a reflectivity of about 70% is achieved.

The mask 36 includes a protection layer 130 formed over the ML 120 for one or more functions. In one example, the protection layer 130 functions as an etch stop layer in a patterning process or other operations, such as repairing or cleaning. In another example, the capping layer functions to prevent oxidation of the ML 120. The protection layer 130 may include one a single film or multiple films to achieve the intended functions. In some embodiments, the protection layer includes a capping layer disposed over the ML 120 and a buffer layer disposed over the capping layer. The capping layer is designed to prevent oxidation of the ML 120. In some examples, the capping layer includes silicon with about 4-7 nm thickness. In other examples, a low temperature deposition process may be chosen to form the capping layer to prevent inter-diffusion of the ML 120. The buffer layer is formed over the capping layer to act as an etching stop layer in a patterning or repairing process of an absorption layer. The buffer layer has different etching characteristics from the absorption layer. In some examples, the buffer layer includes ruthenium (Ru), Ru compounds such as RuB, RuSi, chromium (Cr), Cr oxide, and Cr nitride. A low temperature deposition process is often chosen for the buffer layer to prevent inter-diffusion of the ML 120.

The mask 36 also includes an absorption layer 140 is formed over the protection layer 130. In the present embodiment, the absorption layer 140 absorbs radiation in the EUV wavelength range projected onto a patterned mask. The absorption layer 140 includes multiple film layers with each film containing chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, molybdenum, other suitable materials, or mixture of some of the above. With a proper configuration of multiple film layers, the absorption layer 140 will provide process flexibility in a subsequent etching process by different etch characteristics of each film.

Then, the absorption layer 140 is patterned according to an IC layout pattern (or simply IC pattern). The absorption layer 140 is patterned to define opaque regions 150 and reflective regions 160. In the opaque region 150, the absorption layer 140 remains while in the reflective region 160, the absorption layer 140 is removed.

In the present embodiment, the mask 36 includes at least one defect 115. The defect 115 may include such things as a bump or a pit on the surface of the LTEM substrate 110 (beneath the reflective ML 120) or embedded in the reflective ML 120. The defect 115 may form during fabricating the LTEM substrate 110, the reflective ML 120, or any other process. The defect 115 may cause local deformation of all subsequent layers over it to form a deformation region, referred to as a defect region 170. In the present embodiment, at least one of the reflective regions 160 includes a defect region 170. The defect region 170 may have a large impact on the phase of the light ray reflected from the reflective region 160 where the defect region 170 is located. This is the reason why the defect region 170 is also referred to as the phase-defect region 170. For example, assuming conformal deposition of all subsequent layers, a defect 115 of height or depth of one fourth of the wavelength of the radiation source 32 can cause a 180° phase error for a light ray reflected from this region. In fact, a relatively small fraction of the 180° phase error, e.g., 30°, can have a prominent impact on the lithographic process window or even cause patterning fidelity problems. Therefore, a defect-free LTEM substrate 110 and a defect-free reflective ML 120 are desired. However, this puts constraints in a mask fabrication and may make the mask fabrication become more expensive. The present disclosure offers a method 300 to reduce impacts of the phase-defect region 170.

Figure 3:
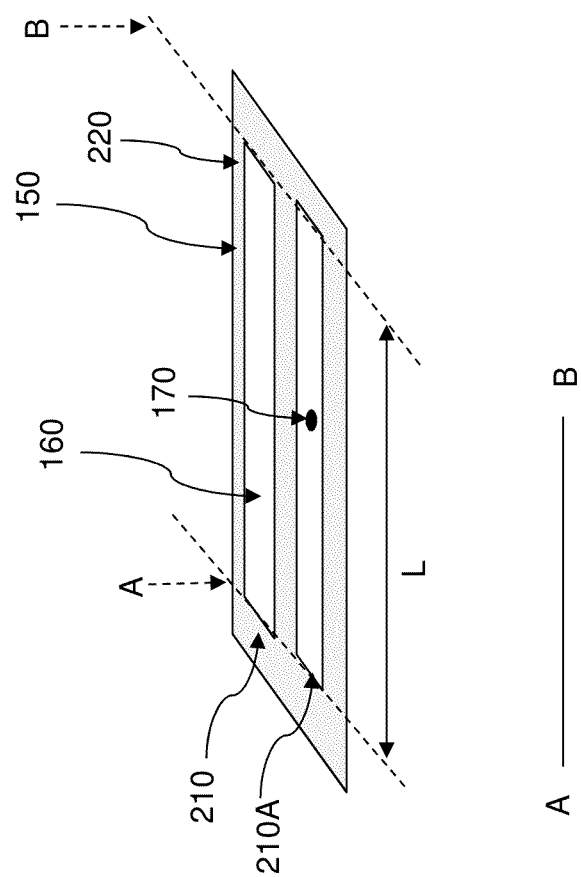
FIG. 3 is a diagrammatic top view of a mask in the lithography process for implementing one or more embodiments constructed in accordance with some embodiments.

Referring to FIG. 3, the reflective regions 160 (or transmissive regions for a refractive mask) of the patterned mask 36 are assigned to polygons 210 having a length L along the first direction AB, representing circuit designs, and the opaque regions 150 are assigned to a field 220, representing the background region on the mask without polygons. The patterned mask 36 has one or more defect or defect region 170 in the reflective region 160. Referring again to FIG. 1, the lithography system 10 also employs a POB 38. The POB 38 includes refractive optics and/or reflective optics, according to a choice of design as known in the art. The POB 38 directs the patterned radiation towards the substrate 40 (e.g., a semi-conductor wafer). The substrate 40 includes a photosensitive layer (e.g., photoresist or resist), which is sensitive to the radiation. The radiation exposure will break polymers in the photoresist into fragments that are dissolved preferentially by a developing solution. The developing solution may remove the exposed or unexposed portions, depending on the photoresist type, to define a pattern. An adequate dose of the radiation exposure is referred to as an optimized exposure dose. The optimized exposure dose is based on an exposure dose for a pre-specified pattern on the patterned mask to achieve a pre-specified dimension on the substrate.

The substrate 40 may be held by a substrate stage 42. The substrate stage 42 provides control of the substrate position such that the image of the patterned mask 36 is scanned onto the substrate in a repetitive fashion (though other lithography methods are possible).

Figure 4:
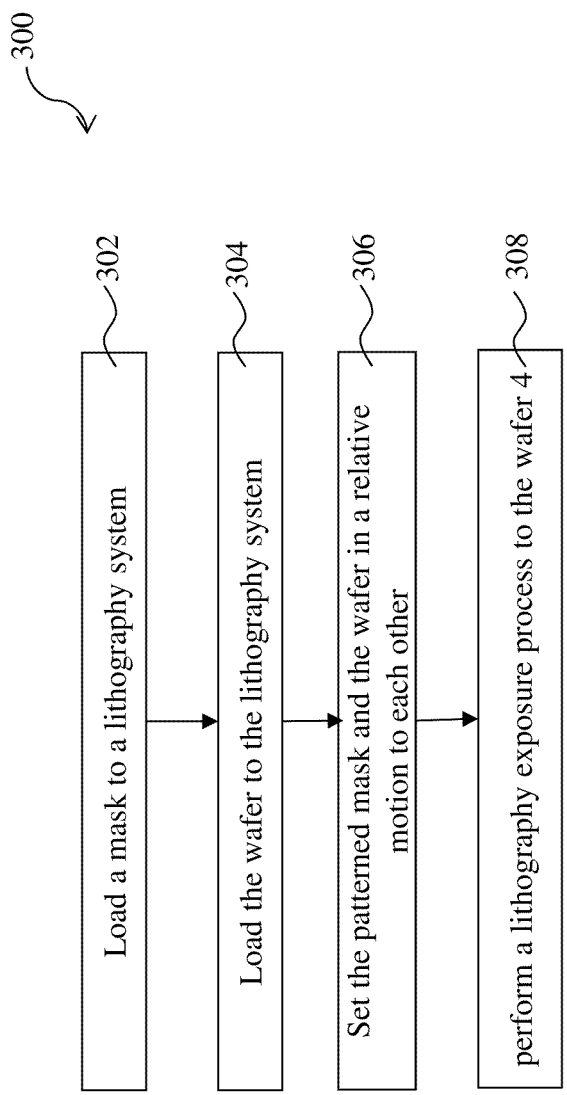
FIG. 4 is a flowchart of a lithography process constructed in accordance with some embodiments.
Figure 5:
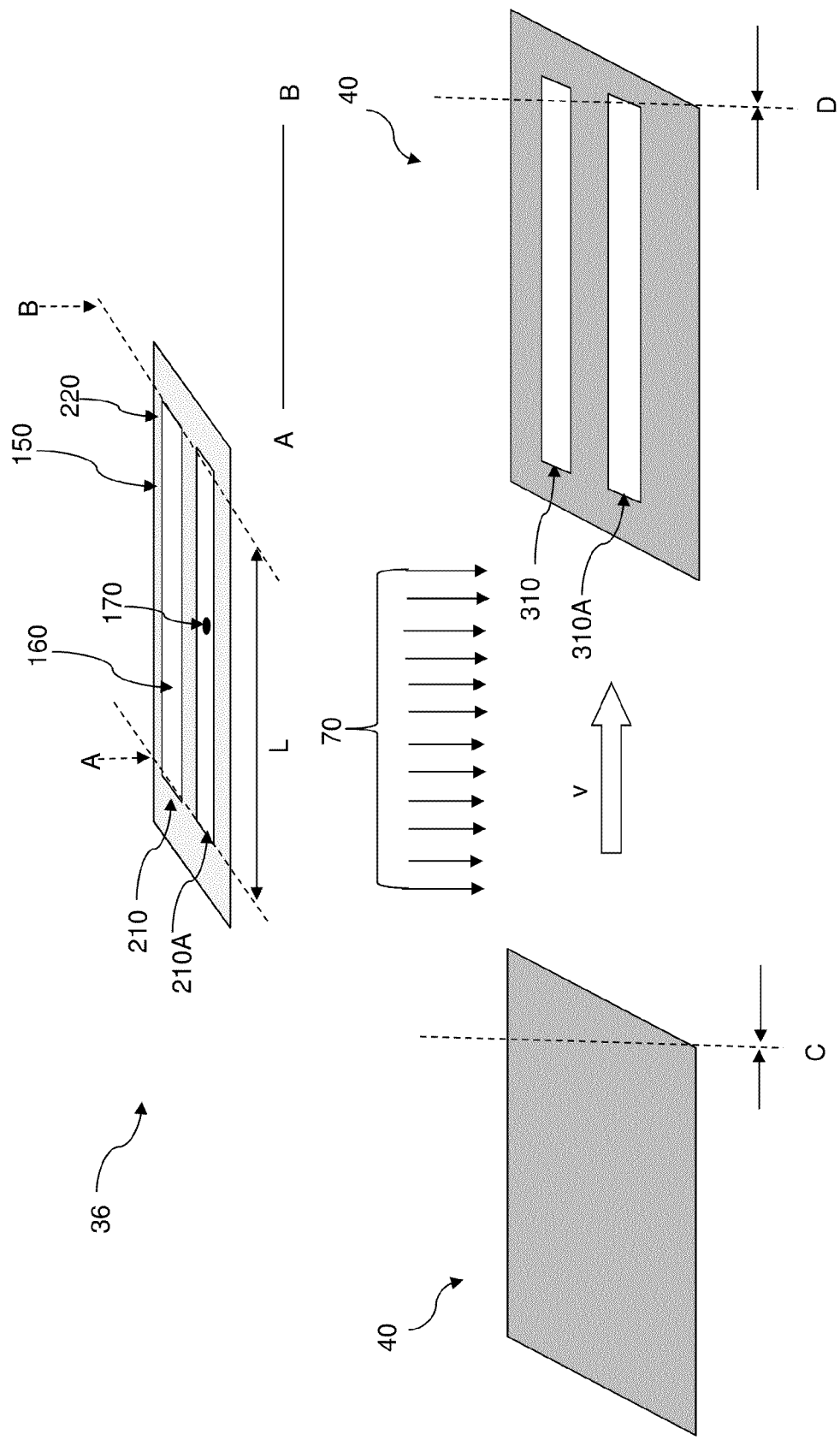
FIG. 5 is a diagrammatic perspective view of a mask and a wafer employed in the lithography process for implementing one or more embodiments by the method of FIG. 4.

FIG. 4 is a flowchart of method 300 for an extreme ultraviolet lithography (EUVL) process. The method 300 can be used for performing a lithography process in an integrated circuit fabrication constructed according to aspects of the present disclosure in various embodiments. FIG. 5 is a diagrammatic perspective view of the lithography system constructed in accordance with the method 300. Referring to FIGS. 1 and 4, the method 300 includes an operation 302 by loading to a lithography system 10 with the patterned mask 36. The operation 302 in the method 300 may further include other steps, such as alignment after the repaired mask 37 is secured on the mask stage.

Referring also to FIGS. 1 and 4, the method 300 also includes an operation 304 to load a substrate 40 to the substrate stage 42 of the lithography system 10. In the present embodiment, the substrate 40 is a semiconductor substrate, such as a silicon wafer. The wafer 40 is coated with a resist layer that is sensitive to the EUV light. The resist layer is to be patterned by a lithography exposure process such that the IC design layout (IC pattern) of the patterned mask 36 is transferred to the resist layer.

Referring FIGS. 4 and 5, the method 300 also includes an operation 306 by setting the patterned mask 40 and the wafer 40 in relative motion to each other along the first direction of AB. In one embodiment, the patterned mask 36 stays in a fixed position while the wafer 40 moves along the first direction of AB. In another embodiment, the patterned mask 36 moves along the first direction of AB while the wafer 40 stays in a fixed position. In yet another embodiment, both of the patterned mask 36 and the wafer 40 move oppositely along the first direction of AB.

Referring again to FIGS. 4 and 5, the method 300 proceeds to operation 308 by performing a lithography exposure process to the wafer 40. The EUV light from the radiation source 32 is modulated by the illuminator 34, directed from the patterned mask 37, the EUV light images the IC pattern of the patterned mask 37 to the wafer 40.

FIG. 5 has been simplified for the sake of clarity to better understand the inventive concepts of the present disclosure. The patterned mask 36 has polygons 210 and 210A. The polygon 210A has the defect region 170. In the present embodiment, the polygon 210, as well as polygon 210A has a first dimension and a second dimension, which is perpendicular to the first dimension. The first dimension is along the first direction of AB, which is substantially longer than the second dimension. The patterned mask 36 stays in a fixed position and the wafer 40 moves along the first direction of AB from a first location C to a second location D with a velocity v. Starting at the first location C, respective regions 310 and 310A in wafer 40 start to receive a patterned radiation exposure 70 reflected (or transmitted) from the patterned mask 36. During the wafer 40 moving towards the second location D, the region 310, as well as the region 301A, continues receiving the patterned radiation exposure 70 till the target reaches the second location D.

In the present embodiment, intensity of the patterned radiation exposure 70 and velocity v of the wafer 40 are designed that an accumulated exposure dose received by the region 310 is the optimized exposure dose after the wafer 40 reaching the second location D. Also, the intensity of the patterned radiation exposure 70 and the velocity v of the wafer 40 are designed that an exposure dose received by the region 410 in each moving location between the first location C and the second location D is substantially lower than the optimized exposure dose. Thus, a radiation exposure reflected (or transmitted) by the defect region 170 is not adequate to make the defect region 170 be printable on a respective region 410A in the wafer 40.

Figure 6:
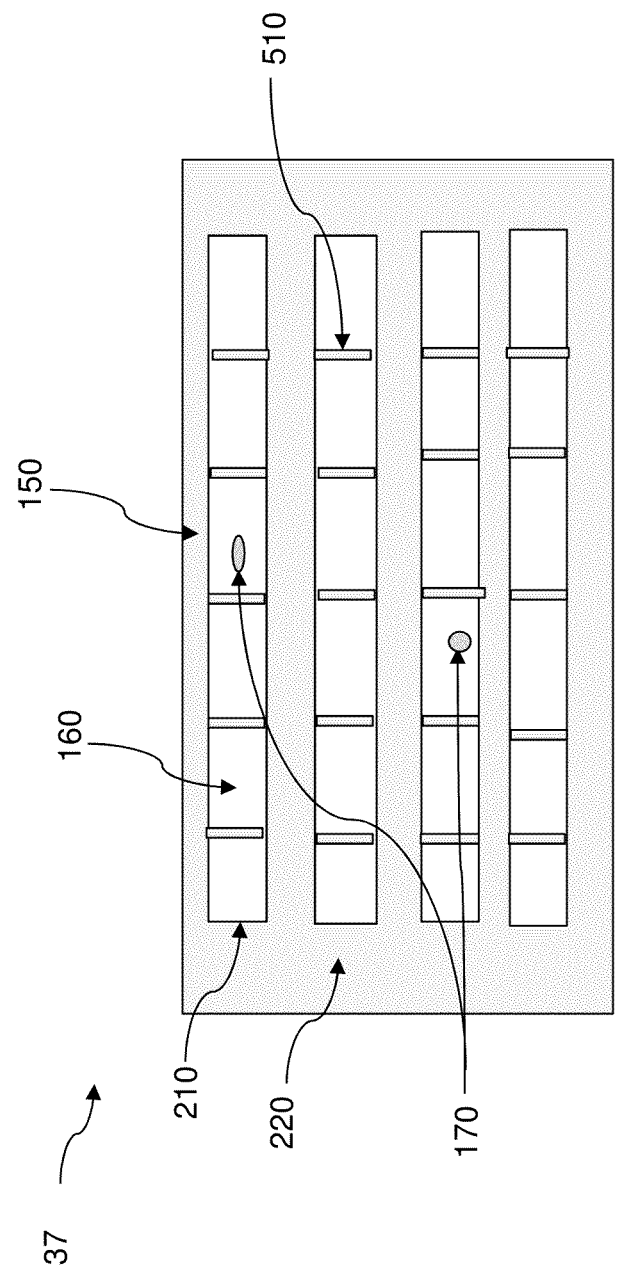
FIG. 6 is a diagrammatic top view of another mask in the lithography process for implementing one or more embodiments constructed in accordance with some embodiments.

By applying this defect-non-printable nature, in another embodiment, a small size structure 510 is added to the patterned mask 36, referred to as the mask 37. As an example, the structure 510 includes a bar (the second region 220 is assigned to the structure 510) in the polygon 210, as shown in FIG. 6, to reduce fragility of the patterned mask 37. In the present embodiment, the size of the structure 510 is substantially smaller than a dimension of polygon 310 in the first direction.

Based on the above, the present disclosure presents a lithography system and process that employs relative motion between a patterned mask and a wafer during exposing process. Due to the relative motion, each point of the wafer receives accumulated exposure dose form many points of the patterned mask. Therefore, an exposure dose from a defect is substantially lower than an optimized dose needed to print the defect on the wafer. The lithography system and process demonstrates significantly reducing defect printability.

The present disclosure is directed towards lithography system and processes. In one embodiment, a lithography system and process includes providing a patterned mask, which has one-dimensional patterns along a first direction. The lithography system and process also includes providing a target having a photosensitive layer disposed on it, exposing the patterned mask by an illuminator and setting the patterned mask and the target in relative motion along the first direction, during exposing the patterned mask. An accumulated exposure dose received by the target is an optimized exposure dose.

In another embodiment, a lithography system and process includes providing a patterned mask. The patterned mask has one-dimensional patterns along a first direction. The lithography system and process also includes providing a target having a photosensitive layer on it. The lithography system and process also includes exposing the patterned mask by an illuminator having an intensity. The lithography system and process also includes setting the patterned mask staying in a fixed location and moving the target along the first direction with a velocity. The target moves from a first location to a second location during exposing the patterned mask. An accumulated exposure dose received by the target is an optimized exposure dose.

In yet another embodiment, an extreme ultraviolet lithography (EUVL) process includes providing a target having a photosensitive layer on it and providing a one-dimensional patterned mask along a first direction. The patterned mask includes a substrate including a first region and a second region. The patterned mask also includes a multilayer mirror above the first and second regions, an absorption layer above the multilayer mirror in the second region and a defect in the first region. The EUVL process also includes exposing the patterned mask by an illuminator setting the patterned mask and the target in relative motion along the first direction with a velocity. The patterned mask or the target moves from a first location to a second location during exposing the patterned mask. An accumulated exposure received by the target is an optimized exposure dose.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography process, comprising:
   providing a patterned mask having one or more one-dimensional patterns along a first direction, wherein the patterned mask includes a reflective region, an opaque region, and a defect region in the reflective region;
   providing a target having a photosensitive layer on it;
   exposing the patterned mask by an illuminator having an intensity; and
   setting an image of the patterned mask and the target in relative motion along the first direction over a time, wherein an accumulated exposure dose received by the target during the time is an optimized exposure dose.

2. The process of claim 1, wherein the patterned mask stays in a fixed position while the target moves in the first direction during exposing one field.

3. The process of claim 1, wherein the target stays in a fixed position while the patterned mask moves in the first direction during exposing one field.

4. The process of claim 1, wherein the optimized exposure dose is based on an exposure dose for a pre-specified pattern on the patterned mask to achieve a pre-specified dimension on the target.

5. The process of claim 1, wherein the reflective region is assigned to a polygon along the first direction and the opaque region is assigned to a filed.

6. The process of claim 5, wherein the patterned mask further includes:
   one or more small size bars, perpendicular to the first direction, in the reflective region.

7. The process of claim 1, wherein the mask is a reflective mask.

8. The process of claim 1, wherein the mask is a transmissive mask.

9. The process of claim 1, wherein providing the target having the photosensitive layer on it includes providing a semiconductor substrate having the photosensitive layer on the semiconductor substrate.

10. The process of claim 1, wherein the patterned mask further includes one or more small size field bars perpendicular to the first direction.

11. A lithography process, comprising:
    providing a patterned mask having one-dimensional patterns along a first direction, wherein the patterned mask includes one or more one-dimensional polygons along the first direction; a field; and one or more defects in at least one of the polygons;
    providing a target having a photosensitive layer on it;
    exposing the patterned mask by an illuminator having a first intensity; and
    setting the patterned mask staying in a fixed location and moving the target along the first direction having a velocity from a first location to a second location during exposing the patterned mask, wherein an accumulated exposure dose received by the target is an optimized exposure dose.

12. The process of claim 11, wherein the patterned mask includes:
    a reflective region assigned to the one-dimension polygon; and
    an opaque region assigned to the field.

13. The process of claim 11, wherein the mask is a reflective mask.

14. The process of claim 11, wherein the mask is a transmissive mask.

15. The process of claim 11, wherein the patterned mask further includes one or more small size field bars perpendicular to the first direction.

16. An extreme ultraviolet lithography (EUVL) process, comprising:
- providing a target having a photosensitive layer on it;
- providing a patterned mask having one or more one-dimensional patterns along a first direction, the patterned mask including:
  - a substrate including a first region and a second region;
  - a multilayer mirror above the first regions and the second regions;
  - an absorption layer above the multilayer mirror in the second region; and
  - a defect in the first region;
- exposing the patterned mask by an illuminator having a first intensity; and
- setting an image of the patterned mask and the target in relative motion along the first direction having a velocity from a first location to a second location while exposing the patterned mask, wherein an accumulated exposure dose received by the target is an optimized exposure dose.

17. The process of claim 16, wherein the intensity and the velocity are configured such that:
- the accumulated exposure dose received by the target is an optimized exposure dose after it traveling from the first location to the second location.

18. The process of claim 16, wherein the pattern mask further includes:
- one or more small size bars perpendicular to the first direction.

19. The process of claim 16, wherein the patterned mask stays in a fixed position while the target moves in the first direction.

20. The process of claim 16, wherein the target stays in a fixed position while the patterned mask moves in the first direction.

* * * * *